United States Patent
Baldwin et al.

(10) Patent No.: US 6,486,740 B1
(45) Date of Patent: Nov. 26, 2002

(54) METHOD AND SYSTEM FOR DYNAMIC COMPENSATION

(75) Inventors: David J. Baldwin, Allen, TX (US); Ross E. Teggatz, McKinney, TX (US); Joseph A. Devore, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/651,568

(22) Filed: Aug. 28, 2000

Related U.S. Application Data

(60) Provisional application No. 60/152,664, filed on Sep. 7, 1999.

(51) Int. Cl.[7] ................................................. H03F 1/14
(52) U.S. Cl. ........................ 330/292; 330/107; 330/294
(58) Field of Search ............................... 330/107, 109, 330/292, 294

(56) References Cited

U.S. PATENT DOCUMENTS

| | | | | |
|---|---|---|---|---|
| 4,246,542 A | * | 1/1981 | Thanos ....................... 330/107 |
| 4,453,132 A | * | 6/1984 | Stamler ....................... 330/109 |
| 4,908,566 A | * | 3/1990 | Tesch ........................... 330/294 |
| 5,635,871 A | * | 6/1997 | Cavigelli ....................... 330/107 |
| 5,852,359 A | * | 12/1998 | Callahan, Jr. et al. ...... 330/109 |
| 5,945,818 A | * | 8/1999 | Edwards ....................... 323/273 |
| 5,990,748 A | * | 11/1999 | Tomasini et al. ............ 330/292 |
| 6,137,356 A | * | 10/2000 | Sakuragi ........................ 330/292 |

* cited by examiner

Primary Examiner—Robert Pascal
Assistant Examiner—Khanh Van Nguyen
(74) Attorney, Agent, or Firm—William B. Kempler; W. James Brady; Frederick J. Telecky, Jr.

(57) ABSTRACT

One aspect of the invention is an integrated circuit (10 or 110) comprising an amplifier (11 or 111) having at least two poles in its frequency response and an output impedance compensation circuit (M1A, M2, M3, AC1 or M1A, M2, M3, M4, AC1) coupled to an output node (30) of the amplifier (11 or 111). The output impedance compensation circuit (M1A, M2, M3, AC1 or M1A, M2, M3, M4, AC1) is operable to create a feedback signal proportional to the impedance of an output load (50) coupled to the output node (30), and create a zero in the frequency response of the amplifier (11 or 111) in response to the feedback signal between the at least two poles.

29 Claims, 1 Drawing Sheet

METHOD AND SYSTEM FOR DYNAMIC COMPENSATION

This application claims priority under 35 USC §119(e)(1) of provisional application No. 60/152,664 filed Sep. 7, 1999.

TECHNICAL FIELD OF THE INVENTION

This invention relates generally to the field of integrated circuits and more particularly to a method and system for dynamic compensation.

BACKGROUND OF THE INVENTION

Integrated circuits often employ a variety of amplifiers, such as voltage regulators, to increase or decrease voltage levels within the integrated circuit. Amplifiers often have at least two poles in their frequency response that are associated with gain and phase behavior. Gain and phase behavior depends upon the circuit design of the amplifier, and can depend upon load circuitry associated with the amplifier.

Conventional amplifier circuits, including voltage regulators, may include an output stage that resembles a class A amplifier stage. Such designs are limited by the output storage capacitance of the circuit. Other designs may employ a class B output configuration with a generally low impedance output and internal compensation to maintain the amplifier within an operable range. Many of these circuit designs are used in applications or with loads having a range of transistor current requirements and load characteristics. However, these designs are often not able to maintain the amplifier within an operable range for these applications or for loads having varying requirements.

Amplifiers using field effect technology generally have high output impedance and the pole contributed by the output load is generally located at a relatively low frequency. Without a zero between the first two poles in the amplifier's frequency response, instability can result. Existing compensation schemes depend on the characteristics of the load. The location of the zero and one or more poles can be affected by the load, if the pole moves due to output load characteristics such that the zero designed into the frequency response for stability is no longer between the first two poles of the amplifier's frequency response. Thus, designing stable amplifiers is difficult without knowing beforehand the load characteristics. Often, however, load characteristics may not be known. Therefore, a system and method is needed to provide effective dynamic compensation for amplifier applications in integrated circuits.

SUMMARY OF THE INVENTION

One aspect of the invention is an integrated circuit comprising an amplifier having at least two poles in its frequency response and an output impedance compensation circuit coupled to an output node of the amplifier. The output impedance compensation circuit is operable to create a feedback signal proportional to the impedance of an output load coupled to the output node, and create a zero in the frequency response of the amplifier in response to the feedback signal between the at least two poles.

The invention provides several important advantages. Various embodiments of the invention may have none, some, or all of these advantages. The invention allows amplifiers in integrated circuits to operate stably under a wide variety of output load conditions. Generic amplifier designs, including voltage regulator designs, may thus be done without detailed knowledge of output load characteristics. Such amplifiers may have reduced circuit area in comparison to amplifiers with other compensation schemes, and may have improved power consumption.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

Figure 1:
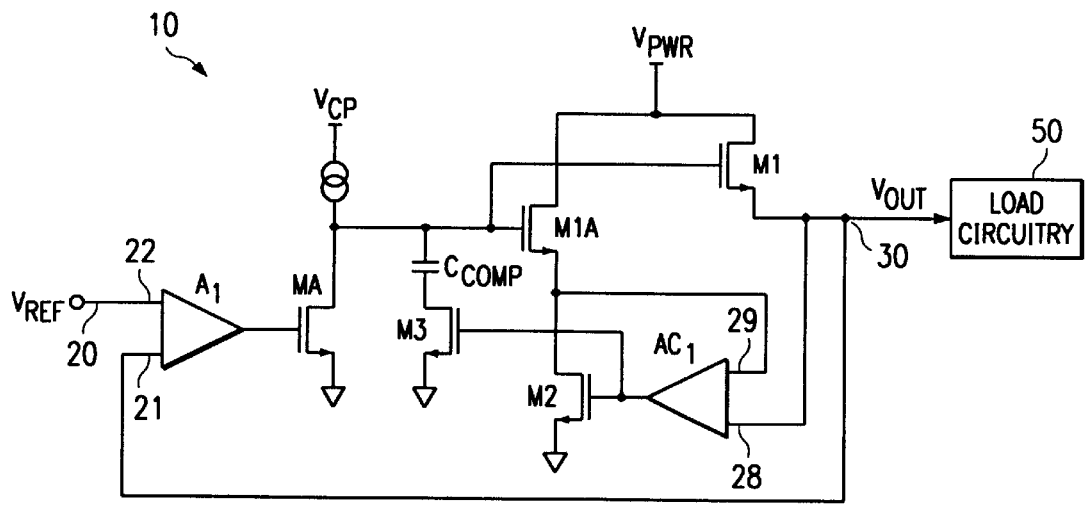
FIG. 1 illustrates a schematic diagram of an integrated circuit constructed in accordance with the teachings of the present invention.
Figure 2:
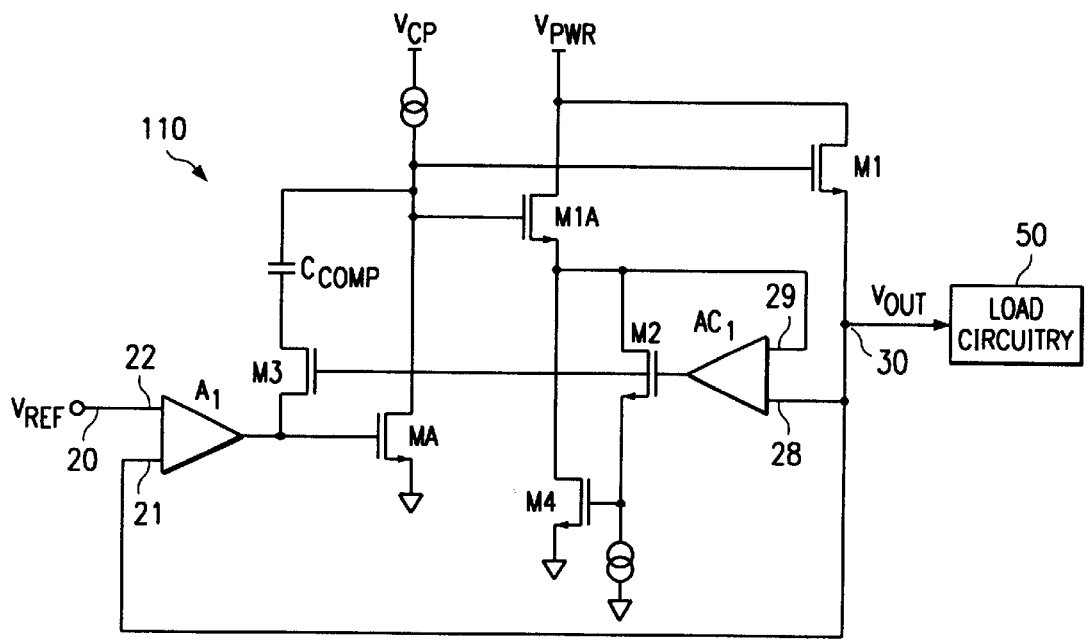
FIG. 2 illustrates a schematic diagram of another integrated circuit constructed in accordance with the teachings of the present invention.

The present invention and its advantages are best understood by referring to FIGS. 1 and 2, like numerals being used for like and corresponding parts of the drawings.

FIG. 1 illustrates a schematic diagram of an integrated circuit 10 constructed in accordance with the teachings of the present invention. It comprises amplifier 11 and load circuitry 50. Amplifier 11 comprises two amplifiers, A1 and AC1, a plurality of field effect transistors M1, M2, M3, M1A, and MA, and a capacitor $C_{comp}$. These components couple input node 20 of amplifier 11 to output node 30 of amplifier 11. Any suitable load circuitry 50 may be coupled to node 30, whether analog or digital. Although direct connections are illustrated for various elements, many elements may be coupled through other elements without departing from the scope of the invention. As further detailed below, compensation circuitry such as transistors M1A, M2, M3 and amplifier AC1 may be coupled to any amplifier having at least two poles in its frequency response to dynamically compensate for variations in output loading, or load impedance, $Z_O$ at output node 30. Such compensation circuitry may be used to introduce a zero between the two poles.

In this embodiment, amplifier 11 comprises a voltage regulator. For example, input 22 of amplifier A1 is coupled to a reference voltage Vref at input node 20, and input 21 is coupled to output node 30 to serve as voltage regulating feedback. Amplifier A1 may represent an input differential pair of transistors, an operational amplifier, or any similar circuit. Field effect transistor MA may comprise part of a transconductance amplifier stage, where the gate of transistor MA is typically low-impedance. Although the invention may be used for regulators, it may also be used for other amplifiers without departing from the scope of the invention.

In this example, amplifier 11 utilizes a typical class AB configuration (e.g., a class A amplification stage with source-follower class B output). The output of amplifier A1 is coupled to the gate of transistor MA, whose drain is coupled to a reference voltage $V_{CP}$ via a load. Reference voltage $V_{CP}$ may comprise any suitable power supply, such as a charge pump providing bias current. The drain of transistor MA is also coupled to capacitor $C_{comp}$, and drives the gate of output transistor M1. Output node 30 couples to load circuitry 50, which has a load impedance $Z_O$. Load circuitry 50 may be digital or analog circuitry.

In this embodiment, the amplifier has at least two poles in the frequency response of the amplifier—a dominant pole and an output pole. A dominant pole of the two-stage amplifier may be determined by the high impedance node at the drain of transistor MA and the gates of output and sense transistors M1 and M1A. This dominant pole may be determined by a $C_{comp}$ that is sized conservatively large enough to insure stable operation. The location in the frequency response of the output pole of the amplifier depends upon $Z_O$ and output transistor M1, and may vary as the impedance $Z_O$ changes.

Compensation circuitry may be coupled to the two-stage amplifier to form amplifier 11 and introduce a zero between the first or dominant pole of the amplifier and its next order pole. Such compensation circuitry may provide additional phase margin and maintain a separation between the two poles as impedance $Z_o$ varies over a wide range of values. Thus, the invention may reduce or eliminate the risk of instability of the amplifier due to variations in impedance $Z_O$. For example, compensation circuitry as illustrated in FIG. 1 may be coupled between the drain of transistor MA and ground. In this embodiment, compensation circuitry comprises transistors M1A, M2, M3 and amplifier AC1.

The drain of transistor MA drives the gate of sense transistor M1A. Transistors M1 and M1A may be coupled together to a suitable reference voltage $V_{PWR}$. The source of transistor M1 is coupled to output node 30 and to input 28 of amplifier AC1. The source of transistor M1A is coupled to the drain of transistor M2, and to input 29 of amplifier AC1. The output of amplifier AC1 drives the gates of transistor M2 and compensation transistor M3. Finally, the drain of compensation transistor M3 may be coupled to capacitor $C_{Comp}$.

Field effect transistors M1, M1A, M2, and M3, when operating in their respective active regions, may act as adjustable resistors to dynamically compensate for changes in impedance Zo. Other types of transistors may also be used without departing from the scope of the invention. For example, bi-polar transistors and P-channel field effect transistors may also be used.

In operation, amplifier 11 dynamically compensates for variations in load impedance $Z_O$ at output node 30. Current flows from $V_{PWR}$ to output node 30 through transistor M1. Because inputs 28 and 29 tend toward the same potential, the gate source voltage $V_{gs}$ of transistor M2 will be generally proportional to current delivered to the load at output node 30. Furthermore, the sources of transistors M1 and M1A should tend toward the same potential. Thus, sense transistor M1A operates to sense the current drawn by load circuitry 50 through transistor M1 in proportion to its size. Sizes for transistors M1A and M1 may be configured as a W/L ratio to suit amplifier 11 design requirements such as cost and circuit area. Thus for example, where transistor M1 is designed with W=1000 and L=1, and transistor M1A with W=10, typical sense current through the drain of transistor M1A is roughly 1/100th of the drain current drawn through transistor M1. In this embodiment, the source of transistor M2 is grounded and thus $V_{gs}$ for compensation transistor M3 will also be generally proportional to the current delivered to the load.

As the current delivered to output node 30 decreases, impedance $Z_O$ at output node 30 typically increases. In this embodiment, the dominant pole of the amplifier typically does not vary with impedance $Z_O$. Compensation capacitor $C_{comp}$ sees an impedance that is dominated by a high impedance associated with the bias source. The output pole, however, does typically vary with the load impedance $Z_O$. A zero to cancel the output pole varies with the ratio of the transconductance of compensation transistor M3 and compensation capacitor $C_{comp}$. Thus, as impedance $Z_O$ increases, sense current through the drain of transistor M1A decreases, and the transconductance of compensation transistor M3 decreases by the reduction in $V_{gs}$ across transistor M2. As a result, the zero moves down in frequency in correspondence with the output pole, thereby forming a first-order dynamic load compensation. The compensation circuitry maintains the zero between the two poles even as one of the poles varies.

In decreased impedance conditions at output node 30, the output pole typically moves out in frequency. In this case, both sense current through transistor M1A and the transconductance of compensation transistor M3 increase by an increase in $V_{gs}$ across transistor M2. As a result, the zero moves out in frequency in correspondence with the pole, thus maintaining amplifier 11 stability.

FIG. 2 illustrates a schematic diagram of another integrated circuit 110 constructed in accordance with the teachings of the present invention. It comprises amplifier 111 and load circuitry 50. In this embodiment, amplifier 111 comprises a voltage regulator constructed using the elements described in conjunction with FIG. 1, although the components are arranged slightly differently. In addition, transistor M4 comprises a part of the compensation circuitry, coupling input node 20 of amplifier 111 to output node 30 of amplifier 111. Thus, compensation circuitry comprises transistors M1A, M2, M3, M4 and amplifier AC1. In addition, transistor M3 and compensation capacitor Cc are coupled between the drain and gate of transistor MA, rather than the drain of transistor MA and ground as illustrated in FIG. 1.

Any suitable load circuitry 50 may be coupled to node 30, whether analog or digital. Although direct connections are illustrated for various elements, many elements may be coupled through other elements without departing from the scope of the invention. As further detailed below, compensation circuitry such as transistors M1A, M2, M3, M4 and amplifier AC1 may be coupled to any amplifier having at least two poles in its frequency response to dynamically compensate for variations in output loading, or load impedance, $Z_O$ at output node 30. This compensation circuitry may also be used to introduce a zero between the two poles of an amplifier, as is described in conjunction with FIG. 1.

In this example, the source of sense transistor M1A is coupled to the drains of field effect transistors M2 and M4. The source of transistor M2 is coupled to the gate of transistor M4, and a current bias to ground. In operation, amplifier AC1 drives the gates of transistors M2 and M4 to match the source voltages for transistors M1 and M1A. Thus, the drain currents of M1 and M1A are typically close in ratio to their sizes, as is discussed in conjunction with FIG. 1.

Amplifier 111 may dynamically compensate for variations in transconductance of load 50 at output node 30. In this embodiment, the impedance of transistor M3 sets a zero to cancel the output pole associated with the impedance $Z_O$ of load 50. Amplifier AC1 drives the gates of transistors M2 and M3, where $V_{gs}$ of transistor M3 varies with the sum of $V_{gs}$ of transistor M2 and the ratio of the current density to the transconductance of transistor M4. Transistors MA and M2 may be similarly sized and biased to have the same current densities. The gate source voltage $V_{gs}$ for transistor M3 is approximately equal to that for transistor M4. The transconductance of transistor M4 varies with the transconductance, and thus current demand, of load 50. Thus, as was discussed in conjunction with FIG. 1, this zero set by transistor M3 varies with the transconductance of transistor M1, and thus load 50, allowing stable operation of amplifier 111 for a variety of loads 50.

As discussed in conjunction with FIG. 1, such compensation circuitry as illustrated in FIG. 2 may also be desirably used to maintain amplifier 111 in operable range as $Z_O$ varies. Similarly, it is also within the scope of the invention to utilize other compensation elements to achieve such dynamic compensation, such as p-channel MOSFETS or bipolar transistors. Further, the embodiment illustrated in FIG. 2 may desirably reduce circuit area needed for dynamic compensation. That is, $C_{comp}$ may be more area-efficient as a result of a Miller effect achieved by the gain of the MA transistor stage.

While the invention has been particularly shown and described by the foregoing detailed description, it will be understood by those skilled in the art that various other changes in form and detail may be made without departing from the spirit and scope of the invention.

What is claimed is:

1. An integrated circuit comprising:
   an amplifier having at least two poles in its frequency response; and
   an output impedance compensation circuit coupled to an output node of the amplifier and operable to create a feedback signal proportional to the impedance of an output load coupled to the output node, and create a zero in the frequency response of the amplifier in response to the feedback signal between the at least two poles wherein the circuit comprises a sense transistor coupled to an output transistor of the amplifier, the output transistor supplying a first current to the output node, the sense transistor operable to supply a second current proportional to the first current.

2. The integrated circuit of claim 1, wherein the amplifier comprises a voltage regulator.

3. The integrated circuit of claim 1, wherein a location of the zero in the frequency response dynamically changes in response to changes in the impedance of the output load.

4. The integrated circuit of claim 1, further comprising a third transistor coupled to the sense transistor and to the output transistor, a gate-source voltage of the third transistor generally proportional to the first and second currents.

5. A voltage regulator, comprising:
   an amplifier having at least two poles in its frequency response and operable to maintain a relatively constant output voltage in response to varying input voltage; and
   an output impedance compensation circuit coupled to the output stage of the amplifier and operable to create a feedback signal proportional to the impedance of an output load coupled to the output stage, and create a zero in the frequency response of the amplifier in response to the feedback signal between the at least two poles, wherein the compensation circuit comprises a sense transistor coupled to an output transistor of the output stage, the output transistor supplying a first current to the load circuitry, the sense transistor operable to supply a second current proportional to the first current.

6. The voltage regulator of claim 5, wherein the compensation circuit is coupled to an amplification stage of the amplifier.

7. The voltage regulator of claim 5, wherein the amplifier comprises a class B output stage.

8. The voltage regulator of claim 5, wherein a location of the zero in the frequency response dynamically changes in response to changes in the impedance of the load circuitry.

9. A method for dynamic compensation, comprising:
   coupling an output impedance compensation circuit to an output node of an amplifier, the amplifier having at least two poles in its frequency response;
   creating a feedback signal using the output impedance compensation circuit proportional to the impedance of load circuitry coupled to the output node; and
   creating a zero in the frequency response of the amplifier in response to the feedback signal between the at least two poles, wherein the circuit comprises a sense transistor coupled to an output transistor of the amplifier, the output transistor supplying a first current to the load circuitry, the sense transistor operable to supply a second current proportional to the first current.

10. The method of claim 9, wherein the amplifier comprises a class B output stage.

11. The method of claim 9, wherein the amplifier comprises a voltage regulator.

12. The method of claim 9, further comprising a third transistor coupled to the sense transistor and to the output transistor, a gate-source voltage of the third transistor generally proportional to the first and second currents.

13. The method of claim 9, wherein a location of the zero in the frequency response dynamically changes in response to changes in the impedance of the load circuitry.

14. An integrated circuit comprising:
   an amplifier having at least two poles in its frequency response; and
   an output impedance compensation circuit coupled to an output node of the amplifier and operable to create a feedback signal proportional to the impedance of an output load coupled to the output node, and create a zero in the frequency response of the amplifier in response to the feedback signal, wherein a location of the zero in the frequency response is dynamically changed in response to changes in the impedance of the output load, to maintain the location of the zero between the two poles where the load impedance would determine the zero to be elsewhere.

15. The integrated circuit of claim 14, wherein the amplifier comprises a voltage regulator.

16. The integrated circuit of claim 14, wherein the amplifier comprises a class B output stage.

17. The integrated circuit of claim 14, wherein the circuit comprises a sense transistor coupled to an output transistor of the amplifier, the output transistor supplying a first current to the output node, the sense transistor operable to supply a second current proportional to the first current.

18. The integrated circuit of claim 17, further comprising a third transistor coupled to the sense transistor and to the output transistor, a gate-source voltage of the third transistor generally proportional to the first and second currents.

19. An integrated circuit comprising:
   an amplifier having at least two poles in its frequency response; and
   an output impedance compensation circuit coupled to an output node of the amplifier and operable to create a feedback signal proportional to the impedance of an output load coupled to the output node, and create a zero in the frequency response of the amplifier in response to the feedback signal between the at least two poles, wherein the circuit comprises a sense transistor coupled to an output transistor of the amplifier, the output transistor supplying a first current to the output node, the sense transistor operable to supply a second current proportional to the first current.

20. The integrated circuit of claim 19, wherein the amplifier comprises a voltage regulator.

21. The integrated circuit of claim 19, wherein the amplifier comprises a class B output stage.

22. The integrated circuit of claim 19, wherein a location of the zero in the frequency response dynamically changes in response to changes in the impedance of the output load.

23. The integrated circuit of claim 19, further comprising a third transistor coupled to the sense transistor and to the output transistor, a gate-source voltage of the third transistor generally proportional to the first and second currents.

24. A voltage regulator, comprising:

an amplifier having at least two poles in its frequency response and operable to maintain a relatively constant output voltage in response to varying input voltage; and an output impedance compensation circuit coupled to the output stage of the amplifier and operable to create a feedback signal proportional to the impedance of an output load coupled to the output stage, and create a zero in the frequency response of the amplifier in response to the feedback signal, wherein a location of the zero in the frequency response is dynamically changed in response to changes in the impedance of the load circuitry, to maintain the location of the zero between the two poles where the load impedance would determine the zero to be elsewhere.

25. A method for dynamic compensation, comprising:

coupling an output impedance compensation circuit to an output node of an amplifier, the amplifier having at least two poles in its frequency response;

creating a feedback signal using the output impedance compensation circuit proportional to the impedance of load circuitry coupled to the output node; and creating a zero in the frequency response of the amplifier in response to the feedback signal, wherein a location of the zero in the frequency response is dynamically changed in response to changes in the impedance of the load circuitry, to maintain the location of the zero between the two poles where the load impedance would determine the zero to be elsewhere.

26. The method of claim 25, wherein the amplifier comprises a class B output stage.

27. The method of claim 25, wherein the circuit comprises a sense transistor coupled to an output transistor of the amplifier, the output transistor supplying a first current to the load circuitry, the sense transistor operable to supply a second current proportional to the first current.

28. The method of claim 25, wherein the amplifier comprises a voltage regulator.

29. The method of claim 27, further comprising a third transistor coupled to the sense transistor and to the output transistor, a gate-source voltage of the third transistor generally proportional to the first and second currents.

* * * * *